United States Patent
Amirpour (10) Patent No.: US 11,611,003 B2
(45) Date of Patent: Mar. 21, 2023

(54) SEMICONDUCTOR COMPONENT, USE OF A SEMICONDUCTOR COMPONENT

(71) Applicant: Fraunhofer-Gesellschaft zur Förderung der angewandten Forschung e.V., Munich (DE)

(72) Inventor: Raul Amirpour, Freiburg (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 25 days.

(21) Appl. No.: 16/648,791

(22) PCT Filed: Oct. 22, 2018

(86) PCT No.: PCT/EP2018/078919
§ 371 (c)(1),
(2) Date: Mar. 19, 2020

(87) PCT Pub. No.: WO2019/081439
PCT Pub. Date: May 2, 2019

(65) Prior Publication Data
US 2020/0287061 A1 Sep. 10, 2020

(30) Foreign Application Priority Data
Oct. 26, 2017 (DE) .......................... 102017125162.6

(51) Int. Cl.
*H01L 29/93* (2006.01)
*H01L 29/20* (2006.01)
(Continued)

(52) U.S. Cl.
CPC .......... *H01L 29/93* (2013.01); *H01L 29/2003* (2013.01); *H01L 29/205* (2013.01); *H01L 29/475* (2013.01)

(58) Field of Classification Search
None
See application file for complete search history.

(56) References Cited

U.S. PATENT DOCUMENTS

| 8,120,014 B2 | 2/2012 | Nabet et al. |
| 2005/0189561 A1* | 9/2005 | Kinzer ................ H01L 29/7787 257/192 |

(Continued)

OTHER PUBLICATIONS

Marso et al (Varactor Diodes based on an AlGaN/GaN HEMT layer structure, 2001) (Year: 2001).*

(Continued)

*Primary Examiner* — Khaja Ahmad
(74) *Attorney, Agent, or Firm* — Volpe Koenig (57) ABSTRACT

A semiconductor component, in particular for a varactor, having at least one first semiconductor layer and a second semiconductor layer. At least two identical surface electrodes are arranged directly or indirectly on the second semiconductor layer facing away from the first semiconductor layer in order to form two anti-serially connected diodes. The surface electrodes are arranged in an interacting manner such that a load carrier zone which forms the common counter electrode for the surface electrodes is arranged in the first semiconductor layer at least in the operating state, and at least one control contact for controlling the potential of the load carrier zone is provided in a region of the load carrier zone on the second semiconductor layer face facing away from the first semiconductor layer. The load carrier zone produces a continuous electric connection from the counter electrode to the at least one control contact at least in the operating state, and the load carrier zone protrudes beyond the surface electrodes in a projection onto the rear face of the semiconductor component.

14 Claims, 5 Drawing Sheets (51) Int. Cl.
*H01L 29/205* (2006.01)
*H01L 29/47* (2006.01)

(56) References Cited

U.S. PATENT DOCUMENTS

| | | | |
|---|---|---|---|
| 2010/0059850 A1 | 3/2010 | Harris | |
| 2013/0320406 A1* | 12/2013 | Fossum | H01L 27/14812 257/225 |
| 2016/0079444 A1* | 3/2016 | Wright | H01L 29/6609 257/599 |
| 2016/0322466 A1 | 11/2016 | Wright | |
| 2017/0125562 A1* | 5/2017 | Prechtl | H01L 29/1029 |

OTHER PUBLICATIONS

Chen K J, et al., "Q-Factor Characterization of RF GaN-Based Metal-Semiconductor-Metal Planar Interdigiitated Varactor", IEEE Electron Device Letters, IEEE Service Center, New York, NY, US, vol. 26, No. 7, pp. 432-434, Jul. 1, 2005.

Romero M.A., et al., "Low dimensionality electronic devices based on heterodimensional Schottky contacts: Modeling and experimental results", 2008 Argentine School of Micro-Nanoelectronics, Technology and Applications, pp. 11-16, Sep. 1, 2008.

Gokkavas, Mutlu et al., "AlGaN-based high-performance metal-semiconductor-metal photodetectors", Phonics and Nanostructures—Fundamentals and Applications, No. 5, pp. 53-62, ScienceDirect (Elsevier B. V.), Jun. 2, 2007.

Chu, Chun San, et al., "A novel RF high-Q metal-semiconductor-metal planar inter digitated varactor based on double-channel AlGaN/GaN HEMT structure", IEEE Radio Frequency Interated Circuits Symp., pp. 385-388, 2005.

Anwar, Amro, et al., "Gate controlled 2-DEG varactor for VCO applications in microwave circuits", IEEE MTT-S IMOC, pp. 585-588, 1999.

Andersoon, Chester, M., et al., "A SiC Varactor with Large Effective Tuning Range for Microwave Power Applications", IEEE Electron Device Letters, Vole 32, No. 6, 3 pages, Jun. 2011.

Hamdoun, Abelaziz, et al., "Characterization of GaN-based HEMTs as Varactor Diode Devices," Proceedings of the 45th European Microwave Conference, pp. 1268-1270, Sep. 7-10, 2015.

Buisman, K, et al., "Distortion-Free: Varactor Diode Toplogies for RF Adaptivity", Laboratory of High-Frequency Technology & Component, Electronic Components, Technology and Materials, Delft University of Technology, The Netherlands, pp. 157-160, 2005.

* cited by examiner

SEMICONDUCTOR COMPONENT, USE OF A SEMICONDUCTOR COMPONENT

TECHNICAL FIELD

The invention relates to a semiconductor component, in particular for a varactor, and to the use of such a semiconductor component.

BACKGROUND

Semiconductor components of this type comprise at least one first semiconductor layer and also a second semiconductor layer, wherein at least two surface electrodes of identical type are arranged directly or indirectly on the side of the second semiconductor layer facing away from the first semiconductor layer in order to form two anti-serially connected diodes.

Semiconductor components of the type mentioned are used in particular for or as varactors. Varactors are also known as variable-capacitance diodes, which are distinguished by the fact that the capacitance can be varied by changing the voltage applied to the diode. Variable-capacitance diodes/varactors thus constitute an electrically controllable capacitance.

Such tunable capacitances are required for tunable (radio-frequency) circuits such as filters, amplifiers or oscillators. In this case, it is usually desirable for said varactors to have a high quality factor in the desired frequency range, in particular in the case of use in filters or oscillators with steep slopes. These high quality factors correspond to a low equivalent series resistance. In this case, the variables of tunable capacitance range, tunable frequency range and also quality factor and loss of the component are in an interaction ratio.

A further crucial factor is the linearity of the varactors. In this respect, it is known from the prior art that two anti-serially connected diodes result in a better linearity of the varactor.

Furthermore, the cost factor is also an important factor: here the consumption of chip area is of crucial importance, firstly with regard to the production costs, secondly with regard to the structural space required for the component, and so a reduction of the area required for the semiconductor component simultaneously results in a reduction of the costs incurred.

The prior art discloses semiconductor components embodied as vertical diodes composed of silicon, gallium arsenide or silicon carbide. By way of example, one such diode is described in the publication C. M. Andersson et al., "A SiC Varactor With Large Effective Tuning Range For Microwave Power Applications", IEEE Electron Device Letters, Vol. 32, No. 6, pages 788-790, June 2011. What is disadvantageous about such vertical diodes is that they offer either high powers/voltages or a low equivalent series resistance or a large tuning range.

Alternatively, the publication A. Hamduon et al., "Characterization of GaN-based HEMTs as varactor diode devices", 10th European Microwave Integrated Circuits Conference (EuMIC), Paris, 2015, p. 417-420, discloses embodying a Three-Port High Electron Mobility Transistor (HEMT) as a varactor. In that case, the connected drain and source contacts form the cathode and the gate contact forms the anode. Both the gate-source diode and the gate-drain diode form the varactor. In this varactor, the drain/source contacts are embodied as ohmic contacts on the surface of the semiconductor component and make a crucial contribution to the equivalent series resistance. In the case of the semiconductor components known from the prior art, said equivalent series resistance is principally composed of the series resistance of the gate electrodes, the sheet resistance in the two-dimensional electron gas of the HEMT and the contact resistance of the ohmic contacts. By virtue of the material system, this varactor makes high powers, high voltages and a large tuning range possible. The comparatively high equivalent series resistance of this form of realization is disadvantageous, however.

In the varactors known from the prior art, in the case of two anti-serially connected diodes, a common central contact usually serves for setting the capacitance of the semiconductor component. Said contact is connected with a high impedance in order not to influence the signal path. In order to achieve the effect that the two anti-serially connected diodes are at the same operating point, the DC potential at the other two connections will usually be identical.

SUMMARY

The present invention is therefore based on the object of improving a semiconductor component of the abovementioned type to the effect of reducing the equivalent series resistance. However, the semiconductor component is nevertheless intended to be suitable for high powers and to be producible in a comparatively cost-effective manner.

This object is achieved by a semiconductor component having one or more features of the invention and by the use thereof. Preferred configurations of the semiconductor component according to the invention are described below. The wording of all the claims is hereby explicitly incorporated by reference in the description.

The semiconductor component according to the invention comprises, as known per se, at least one first semiconductor layer and a second semiconductor layer, wherein at least two surface electrodes of identical type are arranged on the side of the second semiconductor layer facing away from the first semiconductor layer in order to form two anti-serially connected diodes.

What is essential is that said surface electrodes are arranged and embodied in a cooperating manner such that a charge carrier zone is formed in the first semiconductor layer at least in the operating state, said charge carrier zone constituting the common countercontact with respect to the surface electrodes, and that at least one control contact for controlling the potential of the charge carrier zone is provided in a region of the charge carrier zone on the side of the second semiconductor layer facing away from the first semiconductor layer, and the charge carrier zone is embodied at least in the operating state such that, by means of the charge carrier zone, there exists a continuous electrical connection from the counterelectrode to at least one control contact, and the charge carrier zone is embodied in a manner protruding beyond the surface electrodes in a projection onto a rear side of the semiconductor component.

The invention is based on the applicant's insight that it is possible to integrate two anti-serial diodes in such a way that it is possible to dispense with the drain-source contacts as ohmic contacts.

In the context of this description, the side of the second semiconductor layer facing away from the first semiconductor layer is also referred to by the terms surface or top side of the semiconductor component, although this has no limiting effect.

The invention thus differs from previously known semiconductor components in significant aspects: the two anti-serially connected diodes are not connected to one another via a common ohmic contact on the surface of the semiconductor component, but rather are arranged in a manner interacting with one another without such additional surface contacts. The semiconductor component thus only has surface electrodes of identical type (i.e. as anode or cathode) on the surface of the semiconductor component. The semiconductor component is thus also embodied without the usually required associated ohmic contacts on the surface. The common counterelectrode with respect to the surface electrodes is created by the charge carrier zone that forms in the semiconductor component.

Furthermore, a control contact is provided for controlling said charge carrier zone on the side of the second semiconductor layer facing away from the first semiconductor layer. Said control contact can indeed be embodied as an ohmic contact. However, the contact is not situated in the signal path and therefore does not contribute to the equivalent series resistance.

The at least one control contact has an electrical connection to the counterelectrode. For this purpose, the charge carrier zone is embodied in a manner protruding beyond the surface electrodes in a projection onto a rear side of the semiconductor component. By contrast, there is no electrical DC connection between the counterelectrode and the surface electrodes forming a capacitance.

This affords the advantages, in particular, that the equivalent series resistance is significantly reduced as a result of dispensing with the ohmic contacts on the surface of the semiconductor component: the large, lossy ohmic resistances of the surface contacts usually provided on the surface of the semiconductor component are omitted. A large component of the equivalent series resistance is thus omitted as well. This affords the advantage that the equivalent series resistance of the semiconductor component is significantly reduced in conjunction with high power.

In the context of this description, the fact that the semiconductor component is embodied without additional ohmic contacts usually required on the surface means that no such additional contacts are provided in the signal path and therefore they do not contribute to the equivalent series resistance either. Contacts such as, for example, the control contact or other contacts which might become necessary for interconnection, control or optimization can also be provided in the context of the invention and do not depart from the invention.

Furthermore, the required area for the semiconductor component can be significantly reduced since less area is required as a result of the geometrically more compact arrangement and as a result of dispensing with the additional surface contacts. This results in a lower parasitic parallel capacitance and thus in a larger usable frequency range.

Thus, preferably, apart from the control contact(s), the semiconductor component is embodied without further ohmic contacts on the side of the second semiconductor layer facing away from the first semiconductor layer. In this case, the function of these absent contacts as anode and/or cathode, respectively, is preferably performed by the common countercontact, that is to say the charge carrier zone.

This affords the advantage that in the signal path there is no large, lossy ohmic resistance that increases the equivalent series resistance.

In the context of this description, the terms surface electrodes and countercontact denote anode and cathode of the variable-capacitance diodes of the semiconductor component. The polarity, i.e. in particular the assignment of cathode and anode, is not limiting here, and so a respectively opposite assignment (and thus polarity) is likewise within the scope of the invention.

In one preferred embodiment of the invention, the semiconductor component is embodied as a heterostructure. In this embodiment, a two-dimensional electron gas forms at the boundary between the first semiconductor layer and the second semiconductor layer in the first semiconductor layer, said two-dimensional electron gas forming the charge carrier zone. What is advantageous about an embodiment as a heterostructure is that in a simple manner and using previously known techniques, by means of the two-dimensional electron gas, the charge carrier zone can be embodied as controllable and with a low resistance. A further advantage is that very high powers are possible depending on the material system.

The charge carrier zone is embodied at least in the operating state such that, by means of the charge carrier zone, there is a continuous electrical connection from the control contact to the, preferably to every point of the, counterelectrode. In this case, in a projection onto a rear side of the semiconductor component, the continuous electrical connection is intended to extend in a manner not overlapping the gate contacts. The charge carrier zone thus preferably protrudes beyond the dimensions of the surface electrodes in the projection onto the rear side of the semiconductor component in order to ensure a continuous electrical connection from every region of the counterelectrode to the control contact even in operating states that mean a displacement of the charge carriers below the surface electrodes (for example pinch-off). The continuous electrical connection can then extend in the charge carrier zone in regions which do not lie below the surface electrodes and are therefore also not affected by a displacement of the charge carriers.

Preferably, the charge carrier zone is provided in the semiconductor layers (e.g. AlGaN/GaN) over the entire area, wherein all regions in which charge carriers are not desired are insulated. This can be done for example by implantation or etching away of the upper semiconductor layers.

As already explained with regard to the prior art, the capacitance of the individual varactor and thus of the entire semiconductor component can be set by way of a control contact. Preferably, the control contact is embodied as an ohmic contact.

This control contact is preferably connected with a high impedance. In the embodiments according to the invention, this impedance can be realized by way of the sheet resistance of the charge carrier zone and the control contact as ohmic contact. Alternatively, a Schottky contact connected in the forward direction can also be provided instead of the ohmic contact as control contact. This affords the advantage that the capacitance of the semiconductor component is settable and controllable in a simple manner.

The realization using Schottky contacts can be effected in a previously known manner and usually involves simpler processes than a realization using ohmic contacts.

In a further preferred embodiment of the invention, the charge carrier zone (or respectively the two-dimensional electron gas) is embodied with a sheet resistance of between 200 and 800Ω ($\Omega/\square$), preferably less than 400Ω ($\Omega/\square$), preferably less than 300Ω ($\Omega/\square$). Particularly preferably, the two-dimensional electron gas is embodied with the lowest possible sheet resistance. The lower the sheet resistance, the lower usually the equivalent series resistance.

In one preferred embodiment of the invention, the surface electrodes are embodied in the form of finger structures.

Preferably, the finger structures are embodied substantially in linear, in particular rectilinear, fashion in a main direction of extent. Particularly preferably, the at least two surface electrodes are embodied as finger structures interlaced in one another. This affords the advantage that, in a previously known manner, the surface electrodes are embodied as finger structures, preferably as finger structures interlaced in one another and/or as interdigitated finger structures. The small space requirement of such a layout is likewise advantageous.

Preferably, the surface electrodes together with the semiconductor structure form Schottky contacts. The Schottky contacts are operated in the reverse direction.

In one preferred embodiment of the invention, the semiconductor component is embodied on the basis of two high electron mobility transistors. The transistors are embodied as a heterostructure. As surface electrodes, each transistor has a gate contact structure. In both transistors, the ohmic contacts of the source/drain contacts are omitted and the transistors are shifted into one another. The two-dimensional electron gas in the first (here lower) semiconductor layer of the heterostructure forms the charge carrier zone and thus the common countercontact with respect to the gate contact structures. The countercontact thus acts as a common drain/source contact. In this case, the combined drain and source contact forms the cathode and the gate contact structures form the anode of the respective variable-capacitance diode. Both the two gate-source diodes and the two gate-drain diodes form a varactor.

In an alternative embodiment of the invention, the surface electrodes are embodied in ring-shaped fashion, preferably as concentric rings. Respectively alternating ring-shaped surface electrodes of the two diodes are provided in this case. The rings need not be embodied as closed rings in this case, but rather can have interruptions for leading the contacting away and in.

Preferably, the semiconductor component is embodied as a heterostructure composed of III/V semiconductors. Preferably, the semiconductor component is formed from AlGaN/GaN, GaAs/AlGaAs or AlGaAs/InGaAs.

The embodiment of the semiconductor component as a layer structure is suitable for radio-frequency applications, in particular. In this case, the substrate is embodied as highly insulating; low-loss structures are generally suitable here. Preferably, in the case of AlGaN/GaN, the substrate is composed of SiC or sapphire ($Al_2O_3$).

The Schottky diodes (Schottky contacts) are preferably embodied with a breakdown voltage of between 0 and 1000 V, for radio-frequency applications preferably between 10 and 90 V, preferably in the region of 30 V.

In the case of planar structures, the rear-side potential is preferably embodied as floating.

The object of the invention is likewise achieved by the use of a semiconductor component according to the invention or of one of the preferred embodiments described for radio-frequency applications and/or in power electronics.

The semiconductor component according to the invention or one of the preferred embodiments described is suitable, in principle, for applications requiring tunable capacitances in a tunable frequency range with a low equivalent series resistance in conjunction with advantageously high powers.

The semiconductor component according to the invention or one of the preferred embodiments described is therefore preferably suitable for use in tunable components such as, for example, filters, in phase shifters for example for radars, in tunable oscillators, in amplifiers for radio-frequency applications such as, for example, mobile radio applications or software-defined radio applications, in adaptive matching networks for amplifiers, for example in the field of adaptive antenna matching, in tunable radio-frequency switches and also in the field of power electronics, for example for filters. In particular, the semiconductor components must be able to withstand and/or transmit great radio-frequency powers for some applications in the field of power electronics.

BRIEF DESCRIPTION OF THE DRAWINGS

Further preferred features and embodiments of the semiconductor component according to the invention are explained below on the basis of exemplary embodiments and with reference to the figures.

Here in the Figures.

DETAILED DESCRIPTION

In FIGS. 1 to 4, identical reference signs designate identical or identically acting elements.

Figure 1:
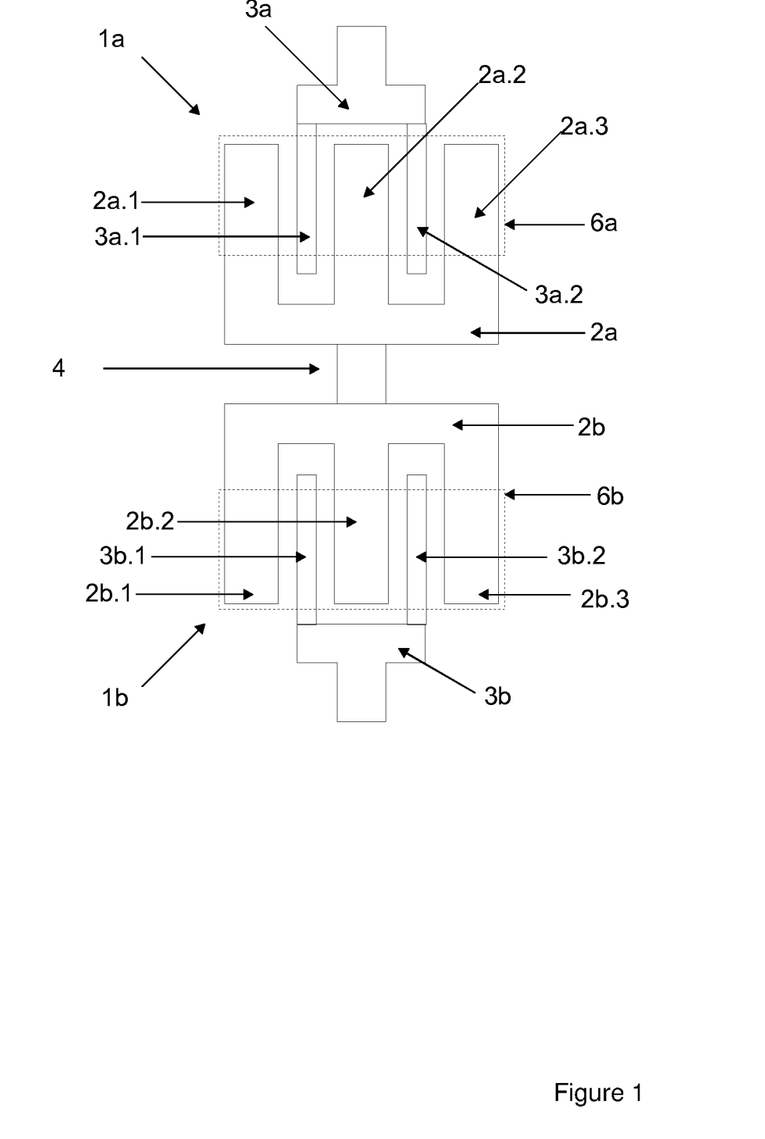
FIG. 1 shows a schematic illustration of two previously known anti-serially connected varactors from the prior art.

FIG. 1 shows two anti-serially connected varactors as known from the prior art.

The varactors 1*a* and 1*b* are derived from an AlGaN/GaN high electron mobility transistor, wherein drain and source fingers were connected. Two drain/source contacts 2*a*, 2*b* are provided on the surface of the semiconductor component (on the side of the second semiconductor layer facing away from the first semiconductor layer). This drain/source contacts 2*a*, 2*b* are embodied with in each case three drain/source fingers 2*a*.1, 2*a*.2, 2*a*.3, 2*b*.1, 2*b*.1, 2*b*.3 and are oriented relative to one another, such that the drain/source fingers 2*a*.1, 2*a*.2, 2*a*.3, 2*b*.1, 2*b*.1, 2*b*.3 point away from one another.

Furthermore, two gate contacts 3*a*, 3*b* are provided on the surface of the semiconductor component. These gate contacts are likewise embodied as a finger structure having in each case two gate fingers 3*a*.1, 3*a*.2, 3*b*.1, 3*b*.2. The gate contacts 3*a*, 3*b* are oriented relative to one another, such that the gate fingers 3*a*.1, 3*a*.2, 3*b*.1, 3*b*.2 point toward one another. In the present case, the gate fingers 3*a*.1, 3.*a*2, 3*b*.1, 3*b*.2 are embodied as Schottky contacts.

In each case a gate contact 3*a*, 3*b* and a drain/source contact 2*a*, 2*b* are shifted into one another in an interdigitated manner, such that the drain/source fingers 2*a*.1, 2*a*.2, 2*a*.3, 2*b*.1, 2*b*.1, 2*b*.3 and the gate fingers 3*a*.1, 3*a*.2, 3*b*.1, 3*b*.2 of the two contact structures, which are shifted into one another, extend alternately and parallel to one another.

In the present case, the drain/source contacts 2 are embodied as ohmic contacts. The drain/source contacts 2*a*, 2*b* are connected via a central contact 4. The central contact 4 serves for setting the capacitance of the varactors 1*a*/1*b* and is connected with a high impedance 5 (cf. FIG. 2).

In the AlGaN/GaN heterostructure, a two-dimensional electron gas forms at the boundary between a first and a second semiconductor layer of the heterostructure. This two-dimensional electron gas is represented schematically by the dashed lines 6*a*, 6*b*.

The equivalent series resistance of the varactor known from the prior art is essentially composed of the gate finger resistance, the sheet resistance in the two-dimensional electrode gas $6a$, $6b$ and the contact resistance of the drain/source contacts $2a$, $2b$ as ohmic contacts. In this case, the ohmic contacts of the drain/source contacts $2a$, $2b$ make a crucial contribution to the equivalent series resistance.

Figure 2:
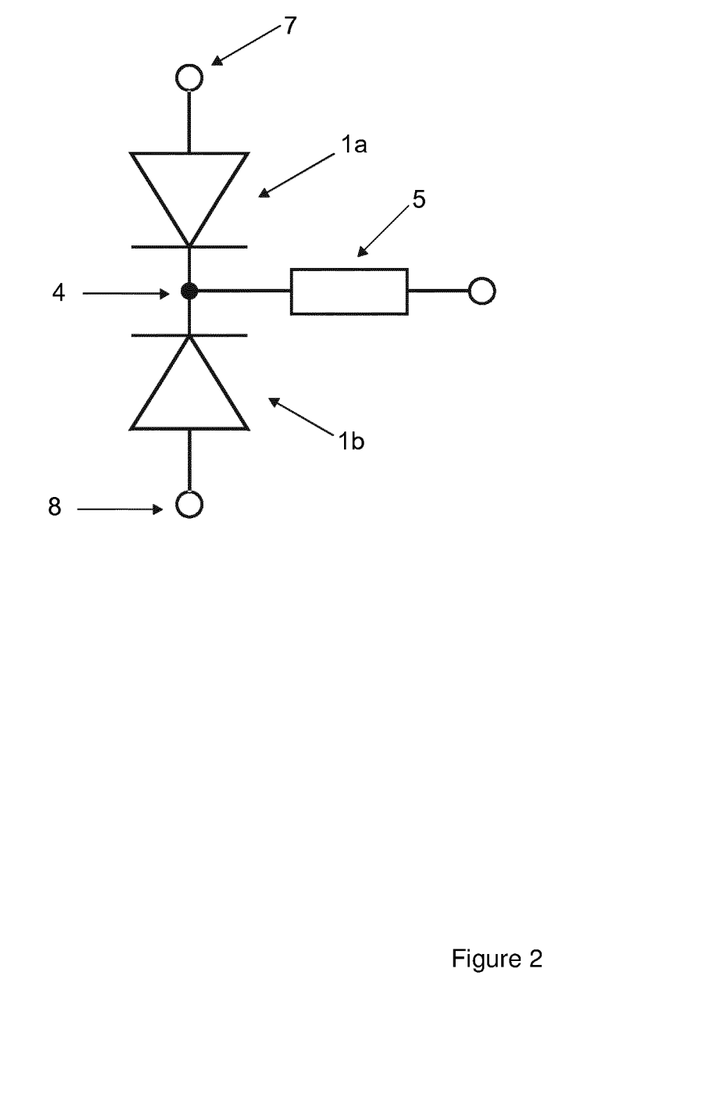
FIG. 2 shows an equivalent circuit diagram of the circuit arrangement from FIG. 1.

The equivalent circuit diagram in FIG. 2 shows the embodiment with two anti-serially connected diodes/varactors $1a$, $1b$ and thus corresponds to the structure from FIG. 1 with an additional resistor 5. The equivalent circuit diagram likewise corresponds to the varactor according to the invention illustrated in FIG. 3.

The anti-serial interconnection results in a better linearity of the varactor. As already described, the central contact 4 serves for setting the capacitance of the varactor and must be connected with a correspondingly high impedance 5. In the present case, the impedance is 1 kOhm.

In the operating state, the DC potential at the two remaining connections 7, 8 should be identical in order that the two diodes $1a$, $1b$ are at the same operating point.

Figure 3:
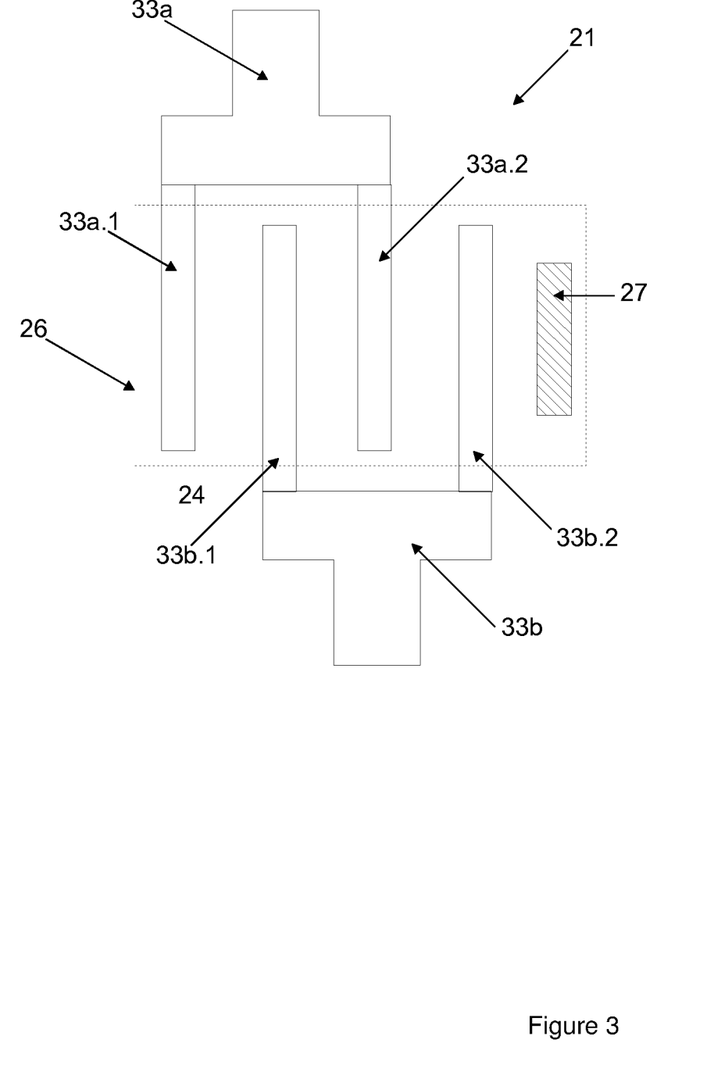
FIG. 3 shows a schematic illustration of a first embodiment of a semiconductor component according to the invention in plan view.

FIG. 3 shows a schematic illustration of a semiconductor component 21 according to the invention in plan view.

Figure 4A:
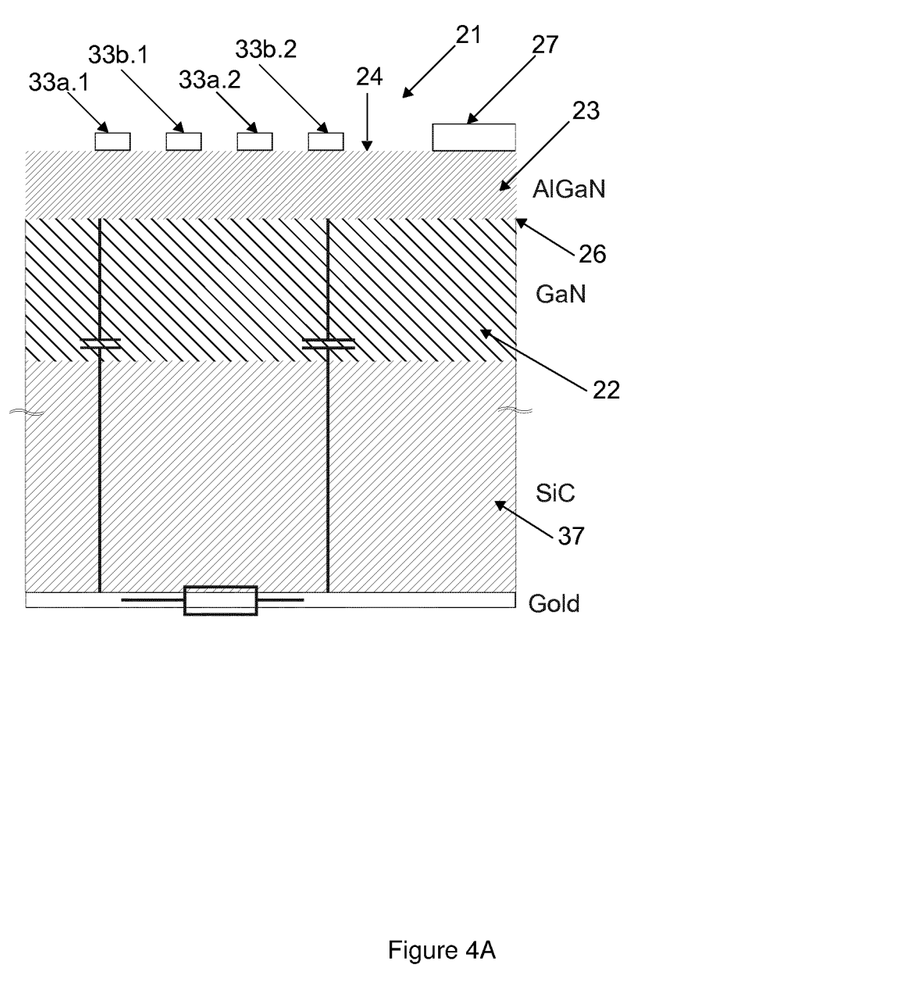
FIGS. 4A and 4B show two embodiments of a semiconductor component according to the invention as a sectional illustration through the semiconductor component.
Figure 4B:
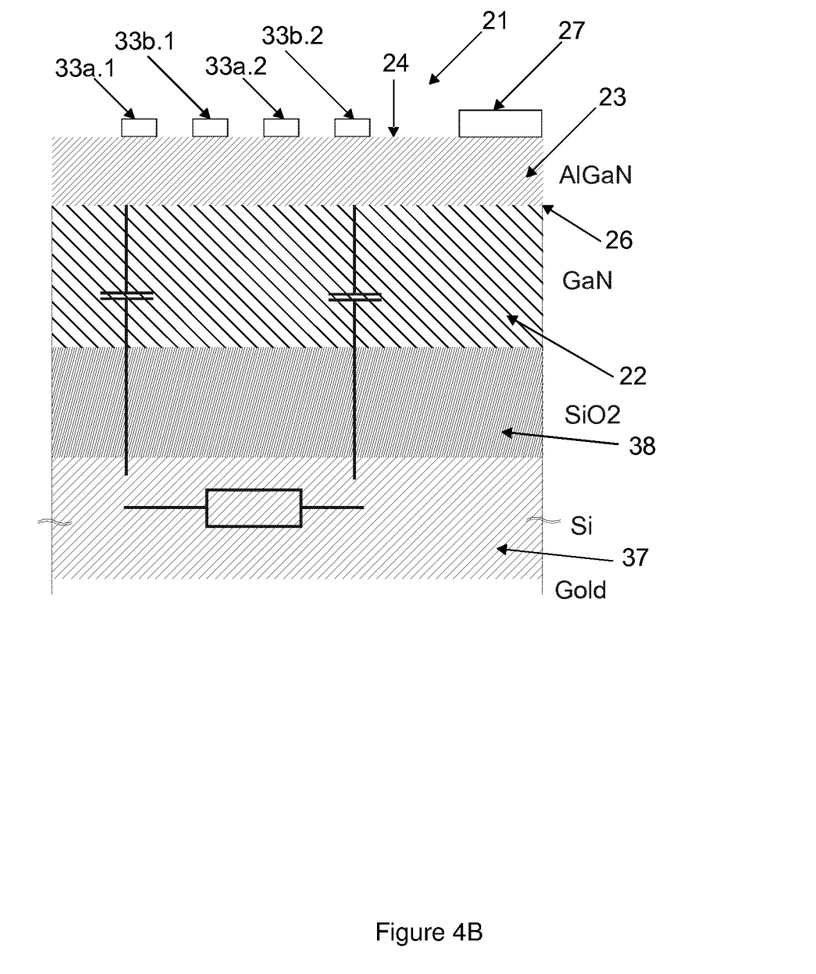

In the present case, the semiconductor component is embodied as a varactor 21. The varactor 21 is embodied as a heterostructure and comprises a first semiconductor layer 22 and a second semiconductor layer 23 (cf. FIG. 4). In this case, the surface 24 of the semiconductor component and of the second semiconductor layer 23, said surface being illustrated in FIG. 3, is the side of the second semiconductor layer 23 facing away from the first semiconductor layer 22.

In the present case, the first semiconductor layer 22 is embodied as a GaN layer. In the present case, the second semiconductor layer 23 is embodied as an AlGaN layer. The first semiconductor layer 22 has a thickness of a few micrometers, 3 μm in the present case. The second semiconductor layer 23 has a thickness of approximately 22 nm.

In the present case, the semiconductor component is embodied on a substrate 37 composed of silicon carbide.

On the surface 24, two gate contacts $33a$, $33b$ are arranged as surface electrodes in order to form two anti-serially connected diodes. In the present case, the surface electrodes are embodied as anode of the respective variable-capacitance diode. The gate contacts $33a$, $33b$ are embodied with in each case two gate fingers $33a.1$, $33a.2$, $33b.1$, $33b.2$ and are shifted into one another. The gate contacts $33a$, $33b$ are thus arranged such that in each case a gate finger of the first, in the illustration upper, gate contact $33a$ and a finger of the second, in the illustration lower, gate contact $33b$ extend in an alternating fashion and alternately parallel.

The gate fingers $33a.1$, $33a.2$, $33b.1$, $33b.2$ are embodied as thin, elongated contacts which are linear in a main direction of extent. In the present case, the length of the gate fingers $33a.1$, $33a.2$, $33b.1$, $33b.2$ is approximately 50 μm. In the present case, the gate fingers $33a.1$, $33a.2$, $33b.1$, $33b.2$ are embodied as Schottky contacts.

The two anti-serially connected diodes are thus not connected via drain/source contacts on the surface of the semiconductor component, rather the gate contacts $33a$, $33b$ are shifted into one another without drain/source contacts on the surface of the semiconductor component 24. The semiconductor component according to the invention is thus embodied without drain/source contacts on the surface 24 of the semiconductor component.

In the operating state, a charge carrier zone 26 forms at the boundary between the first semiconductor layer 22 and the second semiconductor layer 23. In the present case, said charge carrier zone 26 is formed by the two-dimensional electron gas at the boundary between the first semiconductor layer 22 and the second semiconductor layer 23 in the heterostructure. The charge carrier zone 26 forms the common counterelectrode with respect to the gate fingers $33a.1$, $33a.2$, $33b.1$, $33b.2$. In other words, the charge carrier zone 26 as countercontact replaces a combined source contact and drain contact $2a$, $2b$ on the surface of the semiconductor component as described with regard to the prior art. In this case, the charge carrier zone 26 as drain and source contacts forms the cathode and the gate contact structures form the anode of the respective variable-capacitance diode.

In order to control said charge carrier zone 26 and thus the counterelectrode, a control contact 27 is provided on the surface 24 of the semiconductor component. The control contact 27 is embodied as an ohmic contact. Alternatively, instead of being embodied as an ohmic contact, the control contact 27 can also be embodied as a Schottky contact that is connected in the forward direction.

The control contact 27 is arranged in the region of the charge carrier zone 26. That means that, at least in the operating state of the semiconductor component, the charger carrier zone 26 must have an extent that concomitantly includes the control contact 27 in a projection onto the surface 24 of the semiconductor component.

By means of the charge carrier zone 26, there exists a continuous electrical connection from the control contact 27 to every point of the counterelectrode, in particular those below the gate fingers $33a.1$, $33a.2$, $33b.1$, $33b.2$. In the operating state, a displacement of the charge carriers can occur when a positive voltage is applied to the control contact 27 below the gate contacts. In this case, the so-called pinch-off, a continuous electrical contact with the gate fingers and the control contact would not exist if there were not a non-overlapping connection. Therefore, in a projection onto a rear side of the semiconductor component (or the surface 24), said continuous electrical connection must extend in a manner not overlapping the gate fingers $33a.1$, $33a.2$, $33b.1$, $33b.2$. The charge carrier zone 26 must therefore protrude beyond the gate fingers $33a.1$, $33a.2$, $33b.1$, $33b.2$ in order to make said continuous electrical connection over the entire area of the charge carrier zone 26 possible.

The equivalent circuit diagram for the configuration of the invention described corresponds to the equivalent circuit diagram described with regard to FIG. 2.

FIGS. 4A and 4B show two possible embodiments of the layer structure of the semiconductor component and the coupling resulting therefrom.

FIG. 4A shows a varactor 21 in the sectional illustration through the semiconductor component.

The varactor 21 is embodied as a heterostructure and comprises a first semiconductor layer 22 and a second semiconductor layer 23 (cf. FIG. 4A). In this case, the surface 24 of the semiconductor component and of the second semiconductor layer 23, said surface being illustrated in FIG. 3, is the side of the second semiconductor layer 23 facing away from the first semiconductor layer 22.

In the present case, the first semiconductor layer 22 is embodied as a GaN layer. In the present case, the second semiconductor layer 23 is embodied as an AlGaN layer. The first semiconductor layer 22 has a thickness of 3 μm in the present case. The second semiconductor layer 23 has a thickness of approximately 22 nm.

The gate contacts $33a$, $33b$ are arranged on the surface 24 in order to form two anti-serially connected diodes. As described with regard to FIG. 3, the gate contacts $33a$, $33b$ are embodied with in each case two gate fingers 33a.1, 33a.2, 33b.1, 33b.2 and are shifted into one another.

The control contact 27 is additionally illustrated in the sectional illustration.

The heterostructure is embodied on an SiC substrate 37 with a rear-side metallization composed of gold. The SiC substrate exhibits a weak coupling. This results in a high quality factor of the varactor.

FIG. 4B likewise shows a varactor 21 in the sectional illustration through the semiconductor component. In order to avoid repetitions, only the differences between the figures are intended to be discussed below.

Silicon as a conductive substrate 37 is severely lossy. This would result in a strong coupling and thus in a low quality factor of the varactor. This can be improved by an additional insulation layer 38. In the present case, the insulation layer 38 is embodied as an $SiO_2$ layer between the first semiconductor layer and the silicon substrate. The insulation layer 38 results in a weak coupling and thus a high quality factor of the semiconductor component.

The invention claimed is:

1. A semiconductor component comprising:
    at least one first semiconductor layer and a second semiconductor layer;
    at least two surface electrodes of identical type arranged directly or indirectly on a side of the second semiconductor layer facing away from the first semiconductor layer in order to form two anti-serially connected diodes;
    the surface electrodes are arranged and embodied in a cooperating manner such that a charge carrier zone is formed in the first semiconductor layer at least in an operating state, said charge carrier zone forming a common counterelectrode with respect to the surface electrodes, and wherein the surface electrodes are each embodied as a finger structure that are linear in a main direction of extent, and the finger structures are interlaced in one another;
    at least one control contact for controlling a potential of the charge carrier zone provided in a region of the charge carrier zone on the side of the second semiconductor layer facing away from the first semiconductor layer, the control contact in a non-overlapping electrical contact with each of the at least two surface electrodes; and
    the charge carrier zone is embodied at least in the operating state such that, via the charge carrier zone, there exists a continuous electrical connection from the counterelectrode to at least one control contact, and the charge carrier zone is embodied protruding beyond the surface electrodes in a projection onto a rear side of the semiconductor component.

2. The semiconductor component as claimed in claim 1, wherein there are no further ohmic contacts on the side of the second semiconductor layer facing away from the first semiconductor layer other than the at least one control contact.

3. The semiconductor component as claimed in claim 1, wherein the semiconductor component comprises a heterostructure and a two-dimensional electron gas at a boundary between the first semiconductor layer and the second semiconductor layer forms the charge carrier zone.

4. The semiconductor component as claimed in claim 1, wherein the two-dimensional electron gas has a sheet resistance of between 200 and 800Ω (Ω/□).

5. The semiconductor component as claimed in claim 1, wherein the control contact is embodied as an ohmic contact or as a Schottky contact.

6. The semiconductor component as claimed in claim 1, wherein the surface electrodes are embodied as Schottky contacts.

7. The semiconductor component as claimed in claim 1, wherein the surface electrodes are ring-shaped.

8. The semiconductor component as claimed in claim 1, wherein the semiconductor component comprises a heterostructure composed of III/V semiconductor material.

9. The semiconductor component as claimed in claim 1, wherein the semiconductor component is highly insulating with a highly insulating substrate.

10. The semiconductor component of claim 1, wherein the semiconductor component is a varactor.

11. The semiconductor component of claim 7, wherein the ring-shaped surface electrodes are concentric.

12. The semiconductor component of claim 8, wherein the III/V material is at least one of AlGaN/GaN, GaAs/AlGaAs, or AlGaAs/InGaAs.

13. The semiconductor component of claim 9, wherein the substrate is formed from SiC or sapphire, or is formed with an additional insulation layer.

14. The semiconductor component of claim 9, wherein the substrate is formed from SiC or sapphire, and is formed with an additional insulation layer.

* * * * *